June 27, 1967 J. L. E. BALDWIN 3,328,710

DEMODULATOR FOR FREQUENCY MODULATED SIGNALS

Filed July 29, 1964 2 Sheets-Sheet 1

INVENTOR
JOHN LEWIS EDWIN BALDWIN
BY Hane and Nydick
ATTORNEYS

June 27, 1967 J. L. E. BALDWIN 3,328,710

DEMODULATOR FOR FREQUENCY MODULATED SIGNALS

Filed July 29, 1964 2 Sheets-Sheet 2

INVENTOR
JOHN LEWIS EDWIN BALDWIN
BY Haume and Nydick
ATTORNEYS

United States Patent Office 3,328,710

Patented June 27, 1967

3,328,710

DEMODULATOR FOR FREQUENCY MODULATED SIGNALS

John Lewis Edwin Baldwin, Croydon, England, assignor to Rank-Bush Murphy Limited, London, England, a British company Filed July 29, 1964, Ser. No. 385,862

Claims priority, application Great Britain, Aug. 2, 1963, 30,718/63

8 Claims. (Cl. 329—103)

ABSTRACT OF THE DISCLOSURE

A frequency modulated signal demodulator comprises two pairs of serially connected complementary transistors. The base electrodes of one pair of complementary transistors receive one phase of the frequency modulated signal while the base electrodes of the other pair receive the opposite phase of the frequency modulated signal. The collector electrodes of one transistor from each pair are connected in common to one terminal of a source of direct current: the collector electrodes of the other transistor of each pair are connected via a common load impedance to another terminal of the source of direct current. The emitter electrodes of one pair of the transistors are connected in common via a capacitor to the commoned emitter electrodes of the other pair of the transistors. The demodulated signal is developed across the load impedance.

The present invention concerns demodulators for frequency modulated signals and is especially concerned to provide a simple, accurate wide-band demodulator.

According to the present invention a frequency demodulator for frequency modulated signals comprises two transistors of complementary conductivity types, having their emitter-collector paths connected in series with each other and with a load impedance across a source of direct current, a capacitor connected to the junction of the transistors so as to be charged when one of the transistors conducts and discharged when the other of the transistors conducts, together with means for applying the signal to the bases of the transistors with such an amplitude and such a mean potential that the transistors are caused to become conductive alternately.

A preferred embodiment of the invention comprises two pairs of complementary transistors, the transistors of each pair having their emitter-collector paths connected in series. Each of these pairs of transistors is connected between a common load impedance and one terminal of a direct-current supply, to the other terminal of which the load impedance is returned. A capacitor is then connected between the junctions of the transistors in the two pairs. It is advantageous for a differential trimming capacitor to be connected from the terminals of the capacitor to a point of constant potential and for series resistors to be included between the terminals of the capacitor and the junctions of the pair of transistors. In any embodiment of the invention it is also advantageous for means, such as one or more diodes connected in series between the bases of the two transistors of a complementary pair, to be provided to decrease the voltage offset due to the base-emitter diodes of the transistors and to compensate for thermal changes in the characteristics of the transistors.

The invention will be further explained and a preferred embodiment thereof described with reference to the accompanying drawings comprising FIGURES 1 to 3, of which:

Figure 1:
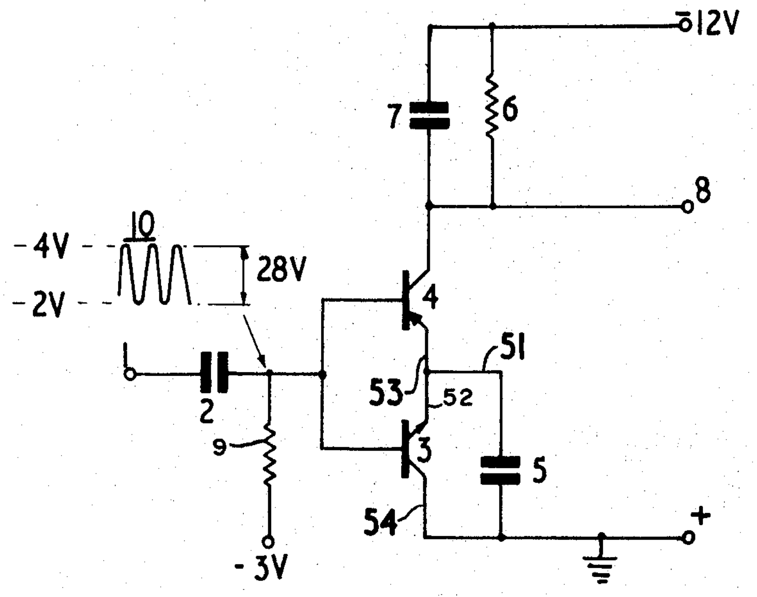
FIGURE 1 is a diagram illustrating the simplest embodiment of the invention.

The demodulator according to the invention which is shown in FIGURE 1 receives at an input terminal 1 a frequency modulated signal, which passes through an isolating capacitor 2 to the common base lead of two transistors 3, 4 of complementary conductivity types. The emitters of these transistors are connected together and to one terminal of a capacitor 5, the other terminal of which is connected to the grounded positive terminal of a direct terminal of a direct-current supply. The collector of the npn transistor 3 is grounded while that of the pnp transistor 4 is returned to the negative terminal of the 12 v. D.C. supply by way of a load impedance comprising a resistor 6 shunted by a capacitor 7. The collector of transistor 4 is also connected directly to an output terminal 8.

The bases of transistors 3, 4 are held at an appropriate direct bias potential, in the present case —3 v., by a suitable bias source to which they are returned through a resistor 9. Alternatively the base connections of these transistors may be as described below in relation to FIGURE 3. The frequency-modulated signal applied to the bases of the transistors 3, 4 is illustrated by waveform 10. It will be seen that the amplitude excursion of this signal is from —2 v. to —4 v., and is thus symmetrical about the bias potential applied to the bases of transistors 3, 4. It is essential to the operation of the invention that the amplitude of this input signal shall remain substantially constant as its frequency varies over the intended modulation range.

The operation of the arrangement described above is as follows: on positive-going half-cycles of the input signal npn transistor 3 will conduct to discharge capacitor 5, while during negative-going half-cycles the pnp transistor 4 will conduct to charge it from capacitor 7. The amount of charge removed or inserted as each transistor conducts is the same, for otherwise the potential of the two emitters will necessarily change to bring about this equality. Thus for each cycle of the applied signal a constant amount of current of which the amount is determined by the amplitude of the drive signal and the capacitance of capacitor 5 will flow through load resistor 6. The potential across load resistor 6 will thus vary in accordance with the frequency of the applied signal, increasing linearly with increasing frequency and decreasing with decreasing frequency, so that the potential appearing at output terminal 8 will be a measure of the frequency of the input signal, as is required for a frequency demodulator.

In modified embodiments of the invention a single resistor may be included in the lead 51 from the commoned emitter electrodes of transistors 3, 4 to capacitor 5. Alternatively there may be included in this lead the series combination of a resistor and an inductor. In another modification, individual, equal resistors are connected in leads 52, 53 which connect the emitter electrodes of transistors 3, 4 to capacitor 5.

Another modification of the arrangement illustrated in FIGURE 1 consists in inserting in lead 54, by which the collector of transistor 3 is shown as being returned directly to a supply terminal, another load impedance equal to that in the collector lead of transistor 4. By this means a balanced output may be made available when required.

In the arrangement described in relation to FIGURE 1 the output voltage will contain a substantial component at the carrier frequency of the input signal. This may be very greatly reduced by the arrangement shown in principle in FIGURE 2, and can be eliminated if the mark:space ratio of the applied signal is unity. In this arrangement antiphased input signals of equal amplitude are applied to the circuit at terminals 11 and 12. Each input signal is applied to the common base lead of a pair of complementary transistors 13, 14 and 15, 16 having their emitter-collector paths connected in series between a terminal of a direct-current supply and a load impedance 17 returned to the other terminal of the supply. A capacitor 18 is connected between the common emitter points of the two pairs of complementary transistors and a differential capacitor 19 has its stators connected to these common emitter points and its rotor grounded. This differential capacitor serves to equalize the stray capacitances associated with the two halves of the circuit and of differences in the value of alpha for transistors 14 and 16. The operation of the two parts of the circuit is identical with that described in relation to FIGURE 1, save that current flowing into capacitor 18 from one pair of transistors flows out through the other pair, instead of passing directly to ground.

Figure 2:
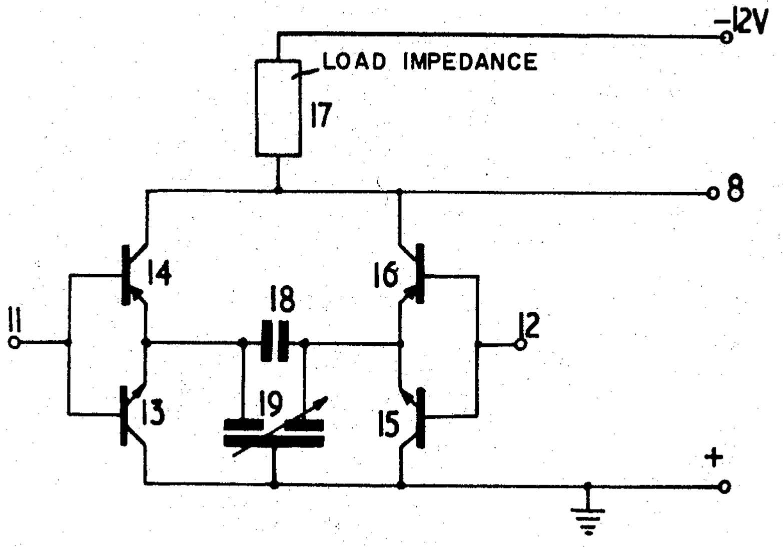
FIGURE 2 is a simplified circuit diagram of a preferred embodiment of the invention.
Figure 3:
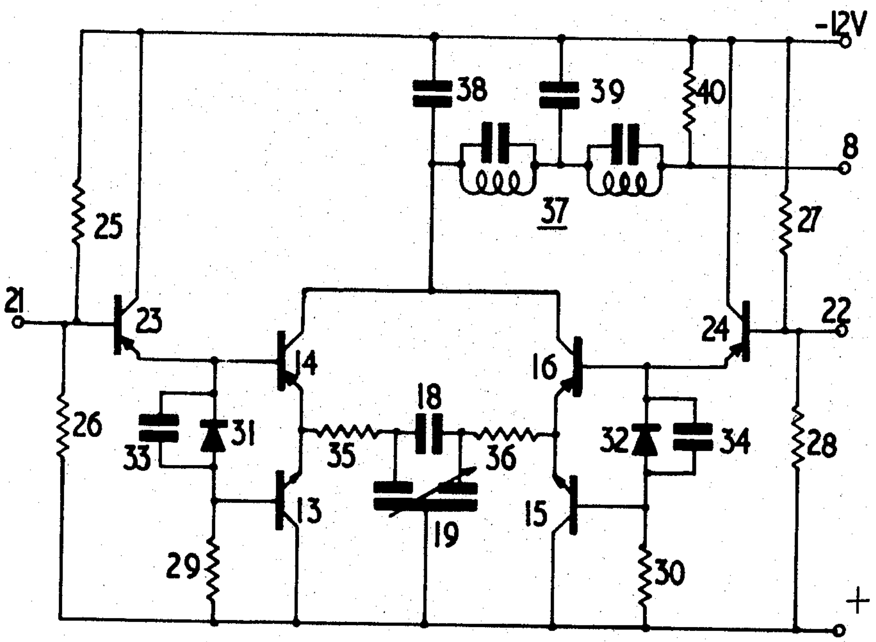
FIGURE 3 is a complete circuit diagram of one embodiment of the invention.

FIGURE 3 shows the circuit diagram of a practical embodiment of the arrangement described above in relation to FIGURE 2. Antiphased signals received at input terminals 21, 22 are applied thence to the bases of respective emitter-follower transistors 23 and 24. The bases of these transistors are held at appropriate direct potentials by means of resistors 25, 26 and 27, 28 through which they are respectively returned to the negative and to the positive supply lines.

As in FIGURE 2, the two input signals are each applied to the bases of a pair of complementary transistors 13, 14 and 15, 16 respectively. Instead of the bases of each pair of transistors being connected directly together, as in FIGURE 2, however, they are here joined through diodes 31, 32—bypassed by respective capacitors 33, 34—which compensate in part for the base-emitter diode voltages of the two transistors and of the variation of these voltages with temperature. This compensation is desirable because the dead zone, in which neither transistors is conductive, which is due to the necessity for a forward bias to produce conduction, otherwise results in a significantly smaller signal at the emitters than at the bases of the transistors of each pair, which is undesirable. Again as in FIGURE 2 a capacitor 18 is connected between the common-emitter points of the two pairs of complementary transistors. In this case, however, resistors 35, 36 are included in series with capacitor 18 to restrict the peak current. A differential trimmer 19 is again used to equalize the stray capacitances in the circuit.

The load impedance for the circuit is in this case constituted by a low-pass filter designated generally by reference 37. This filter may conveniently comprise an m-derived section 38 ($m=0.8$) with its input shunt arm raised to twice the nominal admittance, and an m-derived half-section 39 ($m=0.6$) terminated by a resistor 40 having a resistance equal to the characteristic impedance of the filter.

In a practical embodiment of this circuit arrangement suitable for an input signal varying in frequency between 4 and 10 mc./s. the following component values were employed:

| | | |
|---|---|---|
| Transistors: | | |
| 23, 24 | | ASZ21 |
| 13, 15 | | BSY27 |
| 14, 16 | | AFZ12 |
| Capacitors: | | |
| 18 | pf | 220 |
| 19 | pf | 40+40 |
| 33, 34 | μf | 0.01 |
| Resistors: | | |
| 25, 27 | KΩ | 3.3 |
| 26, 28 | KΩ | 1.5 |
| 29, 30 | Ω | 560 |
| 35, 36 | Ω | 15 |
| 40 | Ω | 330 |

The filter sections 38, 39 were designed to have a characteristic impedance of 330Ω.

While particular embodiments of the invention have been shown and described, it is apparent that changes and modifications may be made without departing from the true spirit and scope of the invention as defined by the appended claims.

I claim:

1. A frequency demodulator comprising, in combination: a source of antiphased signals modulated in frequency in accordance with a modulating signal; first and second input terminals; circuit means for applying said antiphased signals respectively to said first and second input terminals; first and second transistor parts, each said pair comprising two transistors of mutually opposite conductivity types, each said transistor having a baes electrode, a collector electrode and an emitter electrode; connections from said first and second input terminals to said base electrodes of said transistors in said first and second pairs respectively; a capacitor having first and second terminals; connections between the emitter electrodes of the two transistors in one said pair and said first capacitor terminal; connections between the emitter electrodes of the two transistors in the other said pair and said second capacitor terminal; connections commoning the collector electrodes of respective transistors of like conductivity type in said transistor pairs; a source of direct current having first and second terminals; a load impedance connected between one said commoned pair of collector electrodes and said first terminal of said source of direct current; a connection from the other commoned pair of collector electrodes and said second terminal of said source of direct current; an output terminal; a connection from the junction of said collector pair with said load impedance to said output terminal; a bias source; and connections from said bias source to said base electrodes of said transistors; the potential of said bias source being so chosen that said transistors conduct alternately, whereby there arises across said load impedance a potential variation representing said modulating signal.

2. A frequency demodulator in accordance with claim 1 and comprising connections commoning said emitter electrodes of a said pair and a resistance means connecting said commoned emitter electrodes to a said terminal of said capacitor.

3. A frequency demodulator in accordance with claim 1 and comprising a connection from each said input terminal to said base electrode of one said transistor in a respective pair; said bias source comprising a parallel combination of a capacitor and a diode connecting said base electrode to the base electrode of the other said transistor in said pair and individual resistors connecting said base electrodes of said other transistors respectively to a terminal of said direct current source.

4. A frequency demodulator in accordance with claim 1 in which said load impedance is constituted by a terminated low-pass filter.

5. A frequency demodulator for demodulating signals from a source of frequency modulated signals comprising, in combination: at least one pair of first and second transistors of mutually complementary conductive types, each of said transistors having base, emitter and collector electrodes; a capacitor having two plates; means for connecting the emitter electrodes of said pair of transistors to one of said plates; a source of direct current having terminals at different potentials; means for connecting the other of said plates to a terminal of said source of direct current; means for connecting the collector electrode of said first transistor to a terminal of said source of direct current; load impedance means for connecting the collector electrode of said second transistor to another terminal of said source of direct current; circuit means for applying signals from the source of frequency modulated signals to the base electrodes of each of said transistors; means for applying a bias potential to the base electrodes and said transistors, said bias potential being such that said transistors conduct alternatively, whereby there arises across said load impedance means for a potential variation representing the modulation of the frequency modulated signal; and a signal output terminal connected to the junction of said load impedance means and the collector of said second transistor.

6. The frequency demodulator of claim 5 wherein the means for connecting the emitter electrodes of said pair of transistors to one of said plates of said capacitor is a resistor means.

7. The frequency demodulator of claim 6 wherein the emitter electrodes are commoned, and said resistor means comprising a single series resistor is connected between the commoned emitter electrodes and said one plate of said capacitor.

8. The frequency demodulator of claim 5 wherein said circuit means for applying signals from said source of frequency modulated signals to the base electrodes and said means for applying a bias potential to the base electrodes comprise an input terminal for receiving the frequency modulated signals, means for connecting said input terminal to the base electrode of said first transistor, a parallel combination of a further capacitor and a diode means connecting the base electrodes of said transistors, and a resistor connecting the base electrode of said second transistor to the other terminal of said source of direct current.

References Cited

UNITED STATES PATENTS

| | | | |
|---|---|---|---|
| 2,878,384 | 3/1959 | Holmes | 329—103 |
| 3,017,521 | 1/1962 | Herstedt | 307—88.5 |
| 3,209,253 | 9/1965 | Gray | 307—88.5 |

ROY LAKE, *Primary Examiner.*

A. L. BRODY, *Examiner.*